(12) United States Patent
Sato et al.

(10) Patent No.: US 8,518,480 B2
(45) Date of Patent: Aug. 27, 2013

(54) DEVELOPING TREATMENT METHOD, PROGRAM, COMPUTER STORAGE MEDIUM AND DEVELOPING TREATMENT SYSTEM

(75) Inventors: Norifumi Sato, Koshi (JP); Yukio Kiba, Koshi (JP); Tetsushi Miyamoto, Koshi (JP); Kazuhisa Hasebe, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 206 days.

(21) Appl. No.: 13/004,246

(22) Filed: Jan. 11, 2011

(65) Prior Publication Data
US 2011/0183073 A1    Jul. 28, 2011

(30) Foreign Application Priority Data
Jan. 25, 2010  (JP) ................. 2010-013457

(51) Int. Cl.
*B05C 5/02*  (2006.01)
*B05D 1/26*  (2006.01)

(52) U.S. Cl.
USPC ............. 427/240; 118/667; 118/696; 118/69; 118/72; 118/52; 118/56; 118/319; 118/320; 118/302; 118/666

(58) Field of Classification Search
USPC ................. 118/666, 667, 696, 69, 72, 52, 56, 118/319, 320, 302; 396/611; 134/902, 172, 134/99.1; 427/240
See application file for complete search history.

(56) References Cited

U.S. PATENT DOCUMENTS

| 5,580,607 | A  | * | 12/1996 | Takekuma et al. | ............. 427/240 |
| 5,689,749 | A  | * | 11/1997 | Tanaka et al. | ................. 396/611 |
| 2007/0177869 | A1 | * | 8/2007 | Yamamoto et al. | ........... 396/611 |
| 2009/0130614 | A1 | * | 5/2009 | Ookouchi et al. | ............ 430/434 |

FOREIGN PATENT DOCUMENTS

JP    H07-142322 A    6/1995

* cited by examiner

*Primary Examiner* — Laura Edwards
(74) *Attorney, Agent, or Firm* — Posz Law Group, PLC

(57) ABSTRACT

The present invention is a method of developing a resist film on a substrate using a developing solution at a predetermined temperature lower than room temperature, including a first cooling step of mounting and cooling the substrate on a cooling plate at a temperature lower than room temperature and higher than the predetermined temperature in a cooling apparatus; a second cooling step of then carrying the substrate into a developing apparatus and supplying a rinse solution at the predetermined temperature or lower onto the substrate to cool the substrate in the developing apparatus; a developing step of then supplying the developing solution onto the substrate and developing the resist film on the substrate to form a resist pattern in the resist film; and a cleaning step of then supplying a rinse solution at the predetermined temperature onto the substrate to clean a front surface of the substrate.

23 Claims, 13 Drawing Sheets

US 8,518,480 B2

DEVELOPING TREATMENT METHOD, PROGRAM, COMPUTER STORAGE MEDIUM AND DEVELOPING TREATMENT SYSTEM

BACKGROUND OF THE INVENTION

1. Field of the Invention

The present invention relates to a developing treatment method, a program, a computer storage medium and a developing treatment system each for developing a resist film on a substrate using a developing solution at a predetermined temperature lower than room temperature.

2. Description of the Related Art

In a manufacturing process of a semiconductor device, for example, a photolithography processing is performed on a semiconductor wafer (hereinafter, referred to as a "wafer") to form a predetermined resist pattern on the wafer. In the photolithography processing, exposure processing is performed using a substrate for mask on which a predetermined pattern is formed.

The photolithography processing is performed also when forming the predetermined pattern on the substrate for mask. More specifically, a resist coating treatment of applying a resist solution onto a substrate to form a resist film, an exposure processing of exposing the resist film into the predetermined pattern, and a developing treatment of developing the exposed resist film are sequentially performed to form a predetermined resist pattern on the substrate. Using this resist pattern as a mask, an etching treatment of the substrate is performed, and then a removal treatment of the resist film and the like are performed, whereby the predetermined pattern is formed on the substrate.

When forming the predetermined pattern on the substrate, miniaturization of the pattern is desired in order for higher integration of semiconductor devices. Hence, it is required to perform the above-described developing treatment uniformly within the substrate. However, since a developing solution at room temperature is supplied onto the substrate in the conventional developing treatment, the developing speed is high and the development of the resist film starts from the moment when the developing solution comes into contact with the resist film on the substrate. Therefore, it is impossible to develop the resist film uniformly within the substrate.

Hence, to decrease the developing speed of the developing treatment, it is proposed to supply a developing solution at a low temperature, for example, 5° C. onto the substrate (Japanese Laid-open Patent Publication No H7-142322).

However, even if the developing solution at the low temperature is supplied onto the substrate as described in the above document, the developing speed does not sufficiently decrease in some cases because the substrate is at room temperature. As a result, it is impossible to develop the resist film uniformly within the substrate and appropriately form a fine pattern.

SUMMARY OF THE INVENTION

The present invention has been made in consideration of the above points, and its object is to perform a developing treatment using a developing solution at a low temperature uniformly within a substrate to appropriately form a predetermined pattern on the substrate.

The present invention is a method of developing a resist film on a substrate using a developing solution at a predetermined temperature lower than room temperature, including a first cooling step of mounting and cooling the substrate on a cooling plate at a temperature lower than room temperature and higher than the predetermined temperature in a cooling apparatus; a second cooling step of then carrying the substrate into a developing apparatus and supplying a rinse solution at the predetermined temperature or lower onto the substrate to cool the substrate in the developing apparatus; a developing step of then supplying the developing solution onto the substrate and developing the resist film on the substrate to form a resist pattern in the resist film; and a cleaning step of then supplying a rinse solution at the predetermined temperature onto the substrate to clean a front surface of the substrate. Note that room temperature is, for example, 23° C.

According to the present invention, the substrate itself is first cooled via the first cooling step and the second cooling step. After the substrate is cooled to some extent by the cooling plate as described above, the substrate is cooled by the rinse solution, so that the substrate can be cooled down to substantially the predetermined temperature. Accordingly, even though a developing solution at a predetermined temperature lower than room temperature, that is, at a low temperature is supplied onto the substrate in the subsequent developing step, the developing speed can be sufficiently decreased. In addition, since the temperature of the rinse solution supplied onto the substrate in the cleaning step is the same predetermined temperature as the temperature of the developing solution, the resist pattern formed on the substrate is never adversely affected. Accordingly, the developing treatment can be performed uniformly within the substrate to appropriately form a fine pattern on the substrate.

The present invention according to another aspect is a program running on a computer of a control unit controlling a developing treatment system for causing the developing treatment system to execute the developing treatment method.

The present invention according to still another aspect is a non-transistory computer-readable storage medium storing the program.

The present invention according to yet another aspect is a developing treatment system developing a resist film on a substrate using a developing solution at a predetermined temperature lower than room temperature, including: a cooling apparatus including a cooling plate mounting and cooling the substrate thereon; a developing apparatus including a developing solution nozzle supplying the developing solution onto the substrate, and a rinse solution nozzle supplying a rinse solution at the predetermined temperature or lower onto the substrate; and a control unit controlling the cooling apparatus and the developing apparatus to execute a first cooling step of mounting and cooling the substrate on the cooling plate at a temperature lower than room temperature and higher than the predetermined temperature in the cooling apparatus; a second cooling step of then carrying the substrate into the developing apparatus and supplying the rinse solution at the predetermined temperature or lower from the rinse solution nozzle onto the substrate to cool the substrate in the developing apparatus; a developing step of then supplying the developing solution from the developing solution nozzle onto the substrate and developing the resist film on the substrate to form a resist pattern in the resist film; and a cleaning step of then supplying a rinse solution at the predetermined temperature from the rinse solution nozzle onto the substrate to clean a front surface of the substrate.

DETAILED DESCRIPTION OF THE INVENTION

Figure 1:
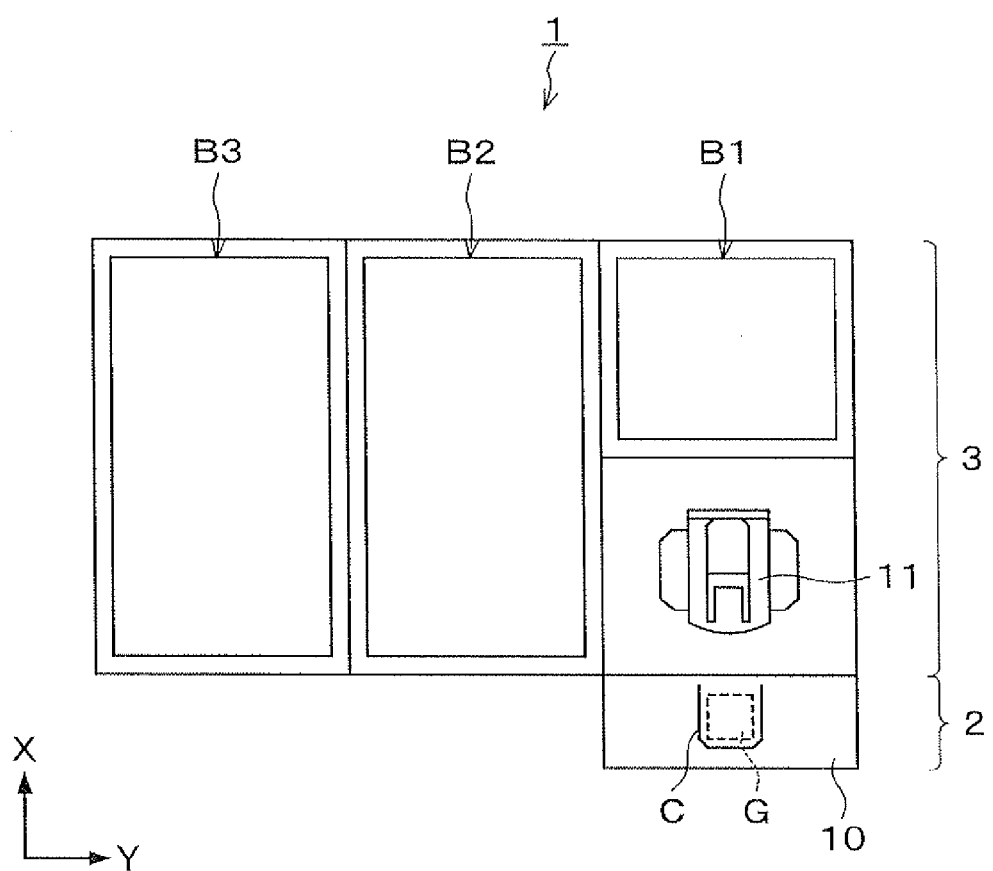
FIG. 1 is a plan view showing the outline of a configuration of a developing treatment system according to this embodiment.
Figure 2:
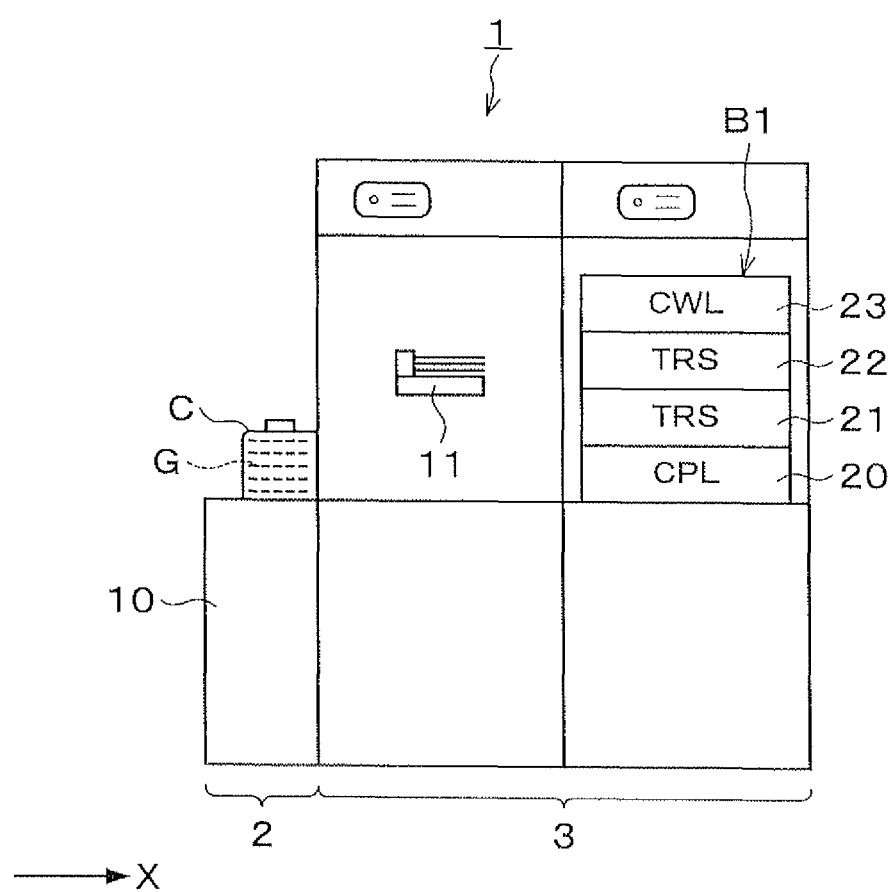
FIG. 2 is a side view showing the outline of the internal configuration of the developing treatment system according to this embodiment.
Figure 3:
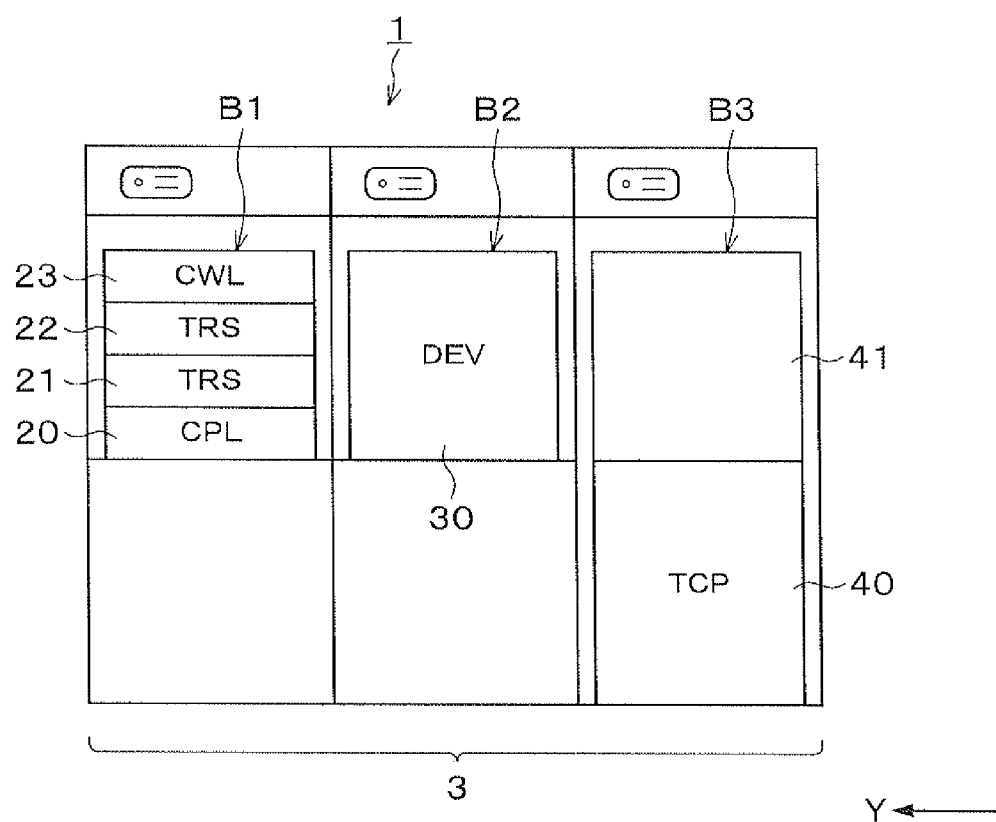
FIG. 3 is a side view showing the outline of the internal configuration of the developing treatment system according to this embodiment.

Hereinafter, a preferred embodiment of the present invention will be described. FIG. 1 is a plan view showing the outline of a configuration of a developing treatment system 1 according to this embodiment. FIG. 2 and FIG. 3 are side views showing the outline of the internal configuration of the developing treatment system 1. Note that a case in which a developing treatment is performed on the above-described substrate G for mask as a substrate will be described in this embodiment. This substrate G has, for example, a quadrilateral shape in plan view and is made of, for example, glass. On the substrate G, a resist film has been formed in advance when it is carried into the developing treatment system 1.

The developing treatment system 1 has, as shown in FIG. 1, a configuration in which, for example, a carry-in/out station 2 for carrying a plurality of, for example, five substrates G per cassette as a unit from/to the outside into/from the developing treatment system 1 and carrying the substrates G into/out of a cassette C; and a treatment station 3 including a plurality of treatment units performing predetermined treatments on the substrate G, are integrally connected.

In the carry-in/out station 2, a cassette mounting table 10 is provided. Note that though one cassette C is mounted on the cassette mounting table 10 in the illustrated example, a plurality of cassettes C may be mounted on the cassette mounting table 10 in a line in a Y-direction (a right-to-left direction in FIG. 1).

In the treatment station 3, a carrier apparatus 11 carrying the substrate G and three treatment blocks B1 to B3 are provided. The carrier apparatus 11 is arranged adjacent to the carry-in/out station 2. The first treatment block B1 is arranged on an X-direction positive direction side (an upward direction side in FIG. 1) of the carrier apparatus 11. The second treatment block B2 and the third treatment block B3 are arranged in this order from the carrier apparatus 11 and the first treatment block B1 side. The carrier apparatus 11 can carry the substrate G to later-described various treatment apparatuses and transition apparatuses arranged in the first treatment block B1 and the second treatment block B2.

In the first treatment block B1, a cooling apparatus 20 cooling the substrate G, the transition apparatuses 21, 22, and a cleaning apparatus 23 housing a cleaning substrate for cleaning a cup of a later-described developing apparatus 30, are four-tiered in order from the bottom as shown in FIG. 2 and FIG. 3.

In the second treatment block B2, the developing apparatus 30 developing the resist film on the substrate G is arranged as shown in FIG. 3. Note that though one developing apparatus 30 is arranged in the illustrated example, a plurality of developing apparatuses 30 may be multi-tiered. Further, the temperature of a developing solution used in the developing apparatus 30 is a temperature lower than room temperature (23° C.), for example, 1° C. to 10° C. and, for example, 3° C. in this embodiment.

In the third treatment block B3, a solution supply apparatus 40 is arranged which supplies various solutions such as the developing solution, a rinse solution, a treatment solution and so on to the developing apparatus 30. Above the solution supply apparatus 40, a control unit 41 is arranged which controls the developing treatment of the substrate G in the developing treatment system 1.

Figure 4:
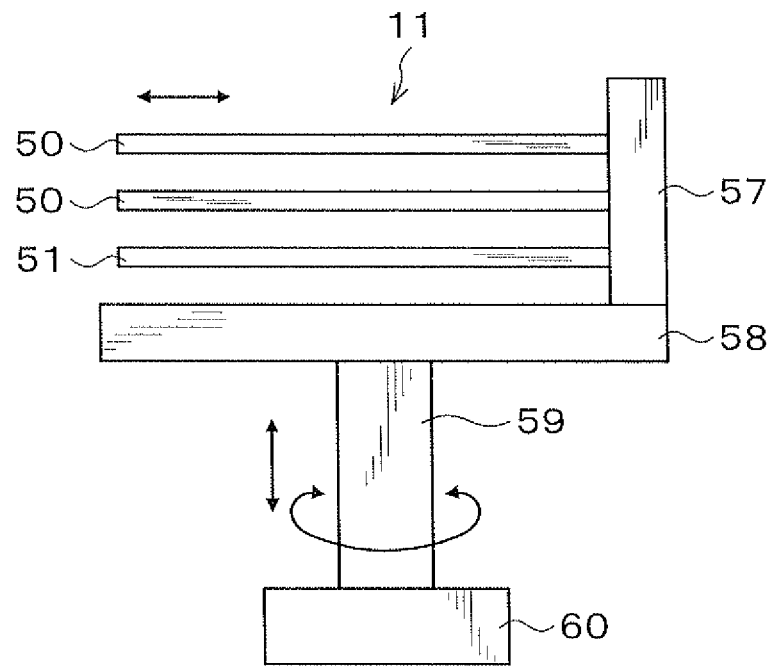
FIG. 4 is a side view showing the outline of a configuration of a carrier apparatus.

Next, the configuration of the above-described carrier apparatus 11 will be described. The carrier apparatus 11 has, for example, two first carrier arms 50, 50 and one second carrier arm 51 each holding and carrying the substrate G, as shown in FIG. 4. Note that the first carrier arm 50 and the second carrier arm 51 have different shapes as will be described later.

Figure 5:
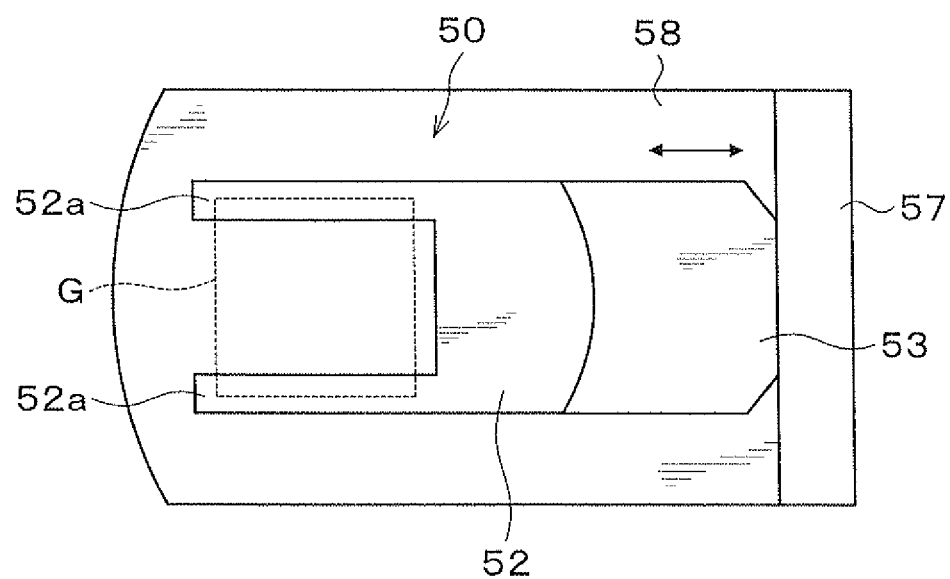
FIG. 5 is a plan view showing the outline of the configuration of the carrier apparatus.

The first carrier arm 50 has an arm part 52 whose tip branches out into two tip portions 52a, 52a and a support part 53 integrally formed with the arm part 52 and supporting the arm part 52 as shown in FIG. 5. At each of the tip portions 52a of the arm part 52, a suction pad (not shown) sucking and holding the rear surface of the substrate G is provided. The first carrier arm 50 can horizontally hold the substrate G on the arm part 52.

Figure 6:
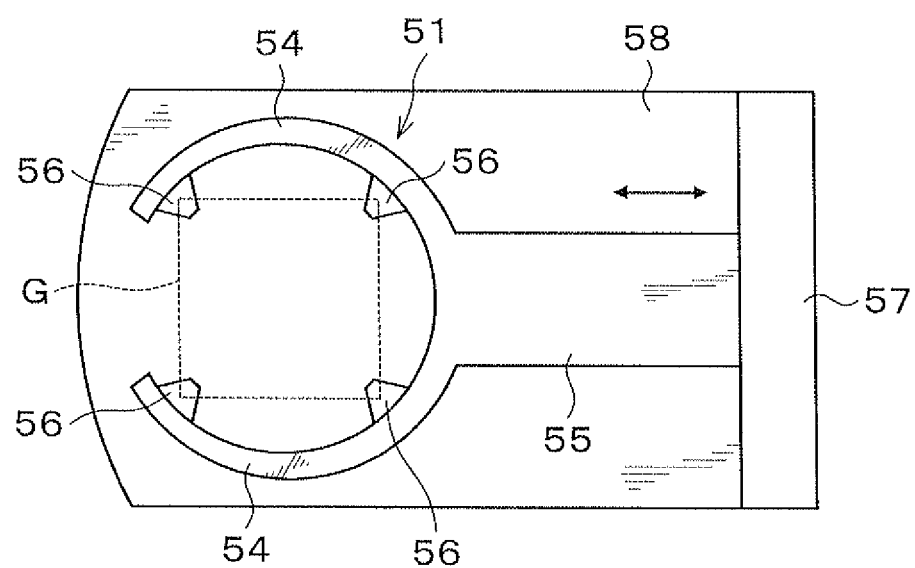
FIG. 6 is a plan view showing the outline of the configuration of the carrier apparatus.

The second carrier arm 51 has an arm part 54 configured in an almost ¾ circular ring shape having a diameter larger than that of the substrate G and a support part 55 integrally formed with the arm part 54 and supporting the arm part 54 as shown in FIG. 6. On the arm part 54, holding parts 56 projecting inward and holding the corners of the substrate G are provided at, for example, four locations. The second carrier arm 51 can horizontally hold the substrate G on the holding parts 56.

At the base end portions of the carrier arms 50, 51, an arm drive part 57 is provided as shown in FIG. 4. By means of the arm drive part 57, each carrier arm 50, 51 can independently move in the horizontal direction. The carrier arms 50, 51 and the arm drive part 57 are supported on a base 58. On the lower surface of the base 58, a rotation and drive part 60 is provided via a shaft 59. By means of the rotation and drive part 60, the base 58 and the carrier arms 50, 51 can rotate around the shaft 59 and rise and lower.

Figure 7:
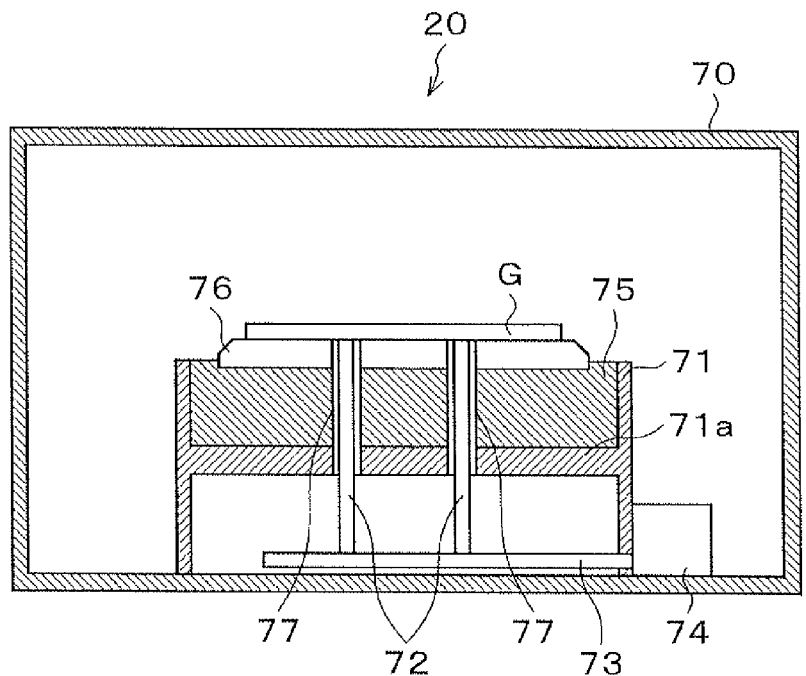
FIG. 7 is a longitudinal sectional view showing the outline of a configuration of a cooling apparatus.
Figure 8:
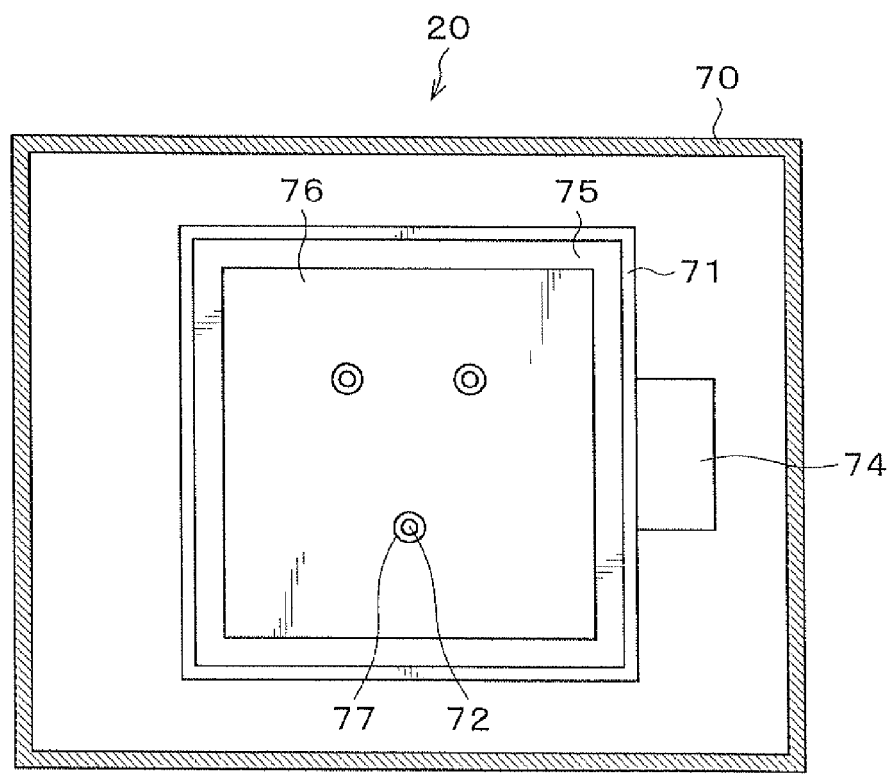
FIG. 8 is a transverse sectional view showing the outline of the configuration of the cooling apparatus.

Next, the configuration of the above-described cooling apparatus 20 will be described. The cooling apparatus 20 has, as shown in FIG. 7 and FIG. 8, a treatment container 70 having a carry-in/out port (not shown) for the substrate G formed in a side surface. The treatment container 70 is capable of hermetically closing its inside, and the temperature of the inside atmosphere is kept at, for example, 15° C. Keeping the inside atmosphere at such temperature can be realized by regulating, for example, the temperature of air to be supplied to the treatment container 70. Note that the temperature of the atmosphere inside the treatment container 70 only needs to be a temperature lower than room temperature (23° C.) and higher than a predetermined temperature (3° C.).

Inside the treatment container 70, a mounting table 71 is provided which horizontally mounts the substrate G thereon. Inside the mounting table 71, raising and lowering pins 72 for passing the substrate G are provided supported by a support member 73. Three raising and lowering pins 72 extend vertically upward through the mounting table 71 and are provided at regular intervals concentrically, for example, around the center of the mounting table 71. At a bottom end portion of the support member 73, a drive part 74 including, for example, a motor for raising and lowering the raising and lowering pins 72 and the support member 73 is provided.

A support surface 71a is provided inside the mounting table 71 and above the support member 73. In a space inside the mounting table 71 above the support surface 71a, a heat insulating material 75 is filled. On the upper surface of the heat insulating material 75, a cooling plate 76 is provided which regulates the substrate G to a predetermined temperature, for example, 15° C. In the support surface 71a, the heat insulating material 75, and the cooling plate 76, though holes 77 through which the above-described raising and lowering pins 72 rise and lower are formed.

Inside the cooling plate 76, a cooling member (not shown) such as a Peltier element is provided and can regulate the cooling plate 76 to a set temperature, for example, 15° C. By mounting the substrate G on the cooling plate 76, the substrate G is cooled to, for example, 15° C. Note that the temperature of the cooling plate 76 only needs to be a temperature lower than room temperature (23° C.) and higher than a predetermined temperature (3° C.).

Figure 9:
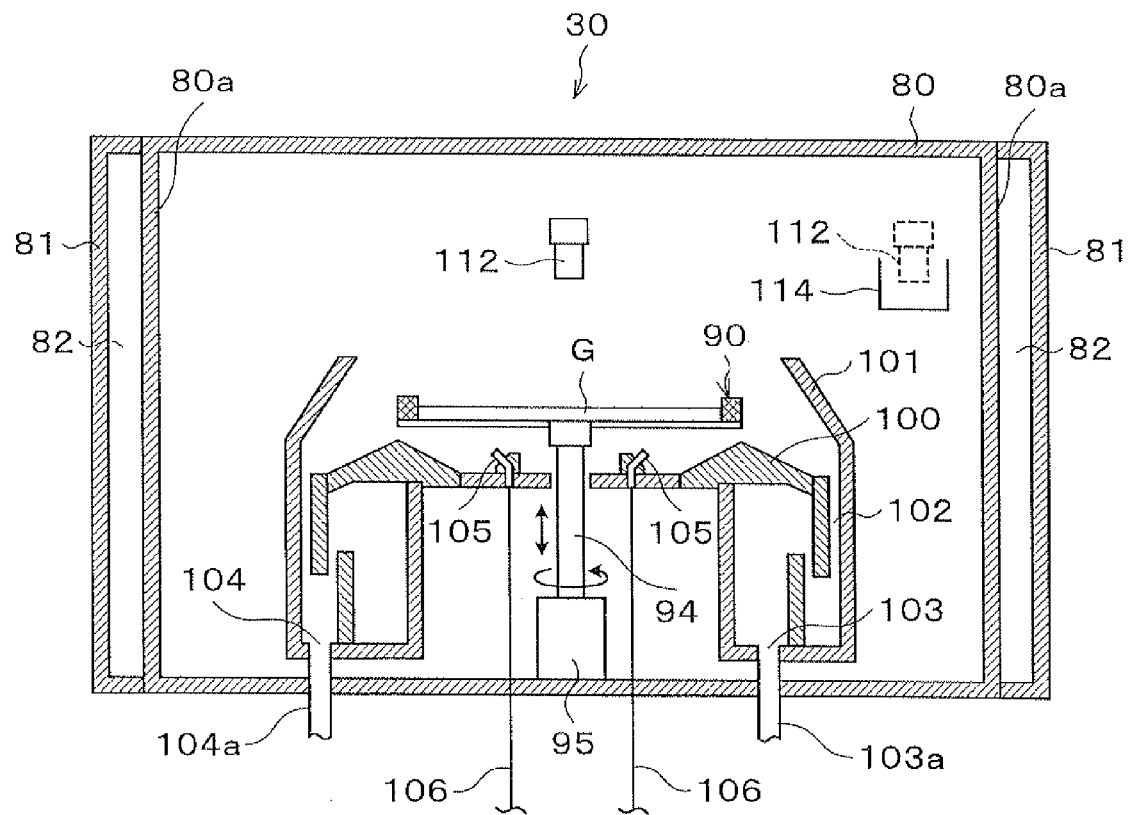
FIG. 9 is a longitudinal sectional view showing the outline of a configuration of a developing apparatus.

Next, the configuration of the above-described developing apparatus 30 will be described. The developing apparatus 30 has, as shown in FIG. 9, a treatment container 80 having a carry-in/out port (not shown) for the substrate G formed in a side surface. The treatment container 80 is capable of hermetically closing its inside, and the temperature of the inside atmosphere is kept at, for example, 15° C. Note that the temperature of the atmosphere inside the treatment container 80 only needs to be a temperature lower than room temperature (23° C.) and higher than a predetermined temperature (3° C.). Keeping the atmosphere inside the treatment container 80 at such temperature can be realized by regulating, for example, the temperature of air to be supplied to the treatment container 80.

Panels 81 are provided on side surfaces 80a of the treatment container 80. Between the side surfaces 80a of the treatment container 80 and the panels 81, air layers 82 are formed. The air layers 82 prevents dew condensation on the panels 81. Note that a purge gas, for example, air or nitrogen gas, containing no moisture may be passed through the air layers 82.

Figure 10:
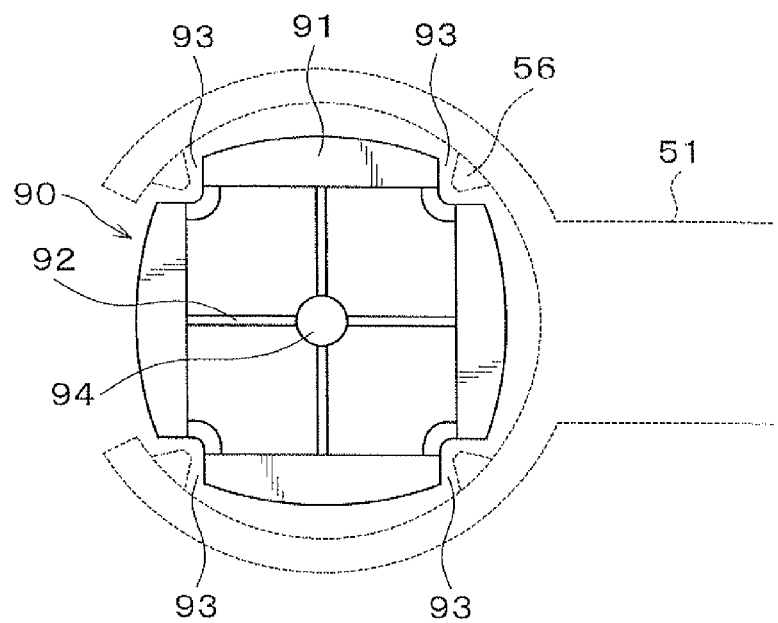
FIG. 10 is a plan view showing the outline of a configuration of a holding member.

Inside the treatment container 80, a holding member 90 holding and rotating the substrate G is provided. The holding member 90 has an accommodating part 91 accommodating the substrate G therein as shown in FIG. 10. At an open lower surface of the accommodating part 91, a support frame 92 supporting the accommodating part 91 is provided. The support frame 92 is arranged in a cross shape around a later-described shaft 94 and can support the lower surface of the substrate G accommodated in the accommodating part 91. The inner periphery of the accommodating part 91 has an almost quadrilateral plane shape matching the outer shape of the substrate G. The outer periphery of the accommodating part 91 has an almost circular plane shape. Further, to avoid the holding parts 56 of the second carrier arm 51 from interfering with the accommodating part 91 when the second carrier arm 51 passes the substrate G to the accommodating part 91, cutout parts 93 are formed at four locations on the outer periphery of the accommodating part 91.

The support frame 92 of the holding member 90 is attached to the shaft 94 as shown in FIG. 9. Below the holding member 90, a rotation and drive part 95 is provided via the shaft 94. By means of the rotation and drive part 95, the holding member 90 can rotate around the vertical at a predetermined speed and rise and lower.

A guide ring 100 projecting upward is provided below the holding member 90, and the outer edge of the guide ring 100 extends folding downward. Further, a cup 101 is provided to surround the holding member 90, the substrate G held on the holding member 90, and the guide ring 100.

The cup 101 has an opening portion larger than the substrate G formed in the upper surface thereof so that the holding member 90 can rise and lower, and has a gap 102 constituting an emission passage formed between the side peripheral surface of the cup 101 and the outer edge of the guide ring 100. The lower side of the cup 101 forms a folded passage together with the outer edge portion of the guide ring 100 to constitute a gas/liquid separating part. An exhaust port 103 is formed in an inner region at the bottom of the cup 101, and an exhaust pipe 103a is connected to the exhaust port 103. Further, a drainage port 104 is formed in an outer region at the bottom of the cup 101, and a drainage pipe 104a is connected to the drainage port 104.

Below the holding member 90 and on the guide ring 100, back rinse nozzles 105, 105 each jetting a rinse solution toward the rear surface of the substrate G are provided at, for example, two locations. To the back rinse nozzle 105, a supply pipe 106 supplying the rinse solution is connected. The supply pipe 106 has a double pipe structure. The rinse solution at, for example, 3° C. flows through an inner pipe of the supply pipe 106, and a purge gas, for example, air or nitrogen gas, at room temperature containing no moisture flows between the inner pipe and an outer pipe. This purge gas prevents dew condensation on the supply pipe 106.

Figure 11:
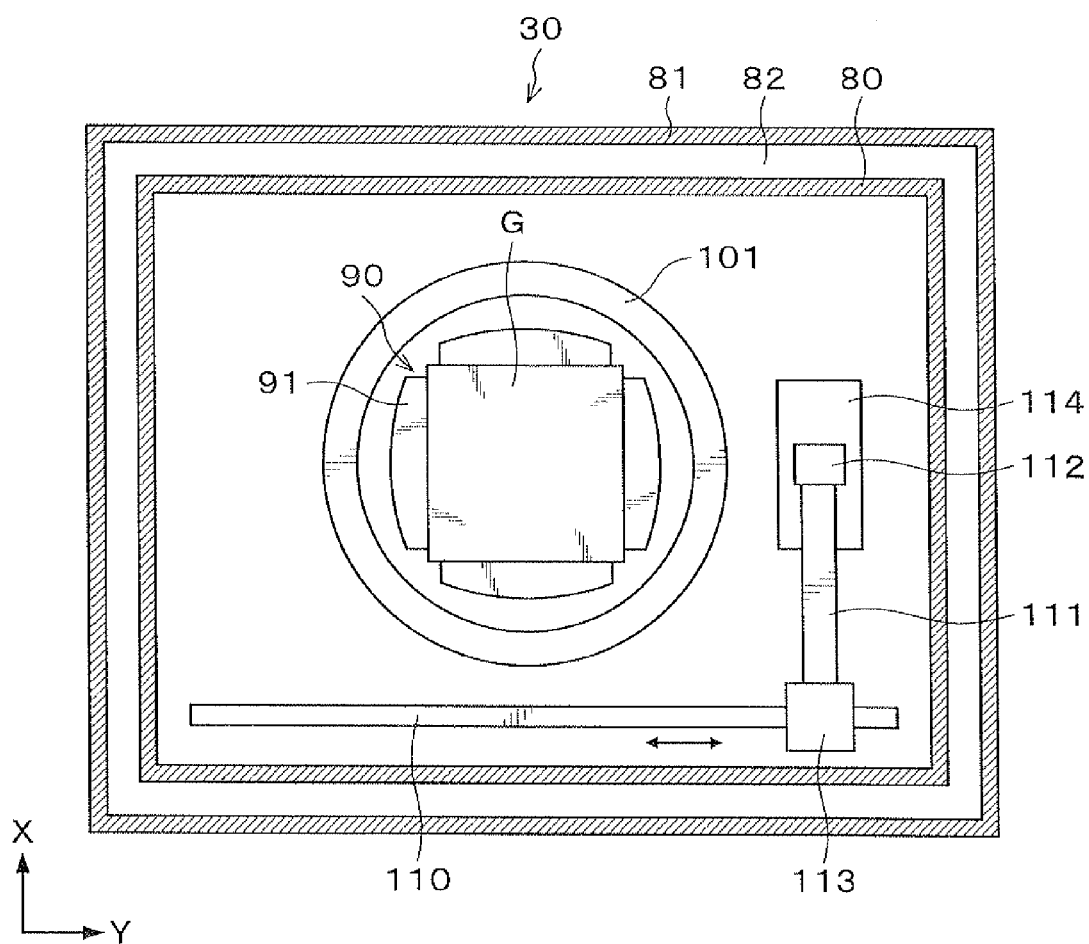
FIG. 11 is a transverse sectional view showing the outline of the configuration of the developing apparatus.

As shown in FIG. 11, on an X-direction negative direction (a downward direction in FIG. 11) side of the cup 101, a rail 110 is formed which extends along a Y-direction (a right-to-left direction in FIG. 11). The rail 110 is formed, for example, from a Y-direction negative direction (a left direction in FIG. 11) side outer position of the cup 101 to a Y-direction positive direction (a right direction in FIG. 11) side outer position. To the rail 110, an arm 111 is attached.

On the arm 111, a complex nozzle body 112 supplying the various solutions onto the substrate G is supported. The arm 111 is movable on the rail 110 by means of a nozzle drive part 113. This allows the complex nozzle body 112 to move from a nozzle bath 114 provided at the Y-direction positive direction side outer position of the cup 101 to a position above a central portion of the substrate G in the cup 101. Further, the arm 111 can freely rise and lower by means of the nozzle drive part 113 to be able to adjust the height of the complex nozzle body 112.

Figure 12:
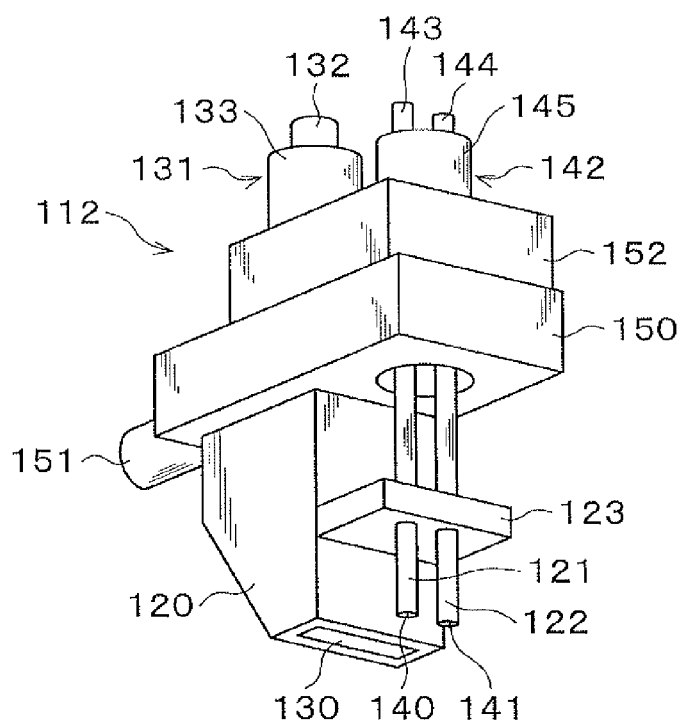
FIG. 12 is a perspective view of a complex nozzle body.

The complex nozzle body 112 has, for example, a developing solution nozzle 120 supplying a developing solution onto the substrate G, a rinse solution nozzle 121 supplying a rinse solution onto the substrate G, and a treatment solution nozzle 122 supplying a treatment solution onto the substrate G as shown in FIG. 12. The rinse solution nozzle 121 and the treatment solution nozzle 122 are fixed to the developing solution nozzle 120 via a fixing member 123.

At the lower end surface of the developing solution nozzle 120, a supply port 130 in a slit shape is formed. The developing solution nozzle 120 can discharge, from the supply port 130, the developing solution in a band shape obliquely downward to the substrate G held on the holding member 90. To the developing solution nozzle 120, a developing solution supply pipe 131 supplying the developing solution to the developing solution nozzle 120 is connected. The developing solution supply pipe 131 has a double pipe structure. Through an inner pipe 132 of the developing solution supply pipe 131, the developing solution temperature-regulated at, for example, 3° C. flows. The inner pipe 132 communicates with the supply port 130. Between the inner pipe 132 and an outer pipe 133, a purge gas, for example, air or nitrogen gas, at room temperature containing no moisture flows. This purge gas prevents dew condensation on the developing solution supply pipe 131.

At the lower end surfaces of the rinse solution nozzle 121 and the treatment solution nozzle 122, supply ports 140, 141 in an almost circular shape are formed respectively. The positions on the substrate G to which the rinse solution and the treatment solution supplied from the rinse solution nozzle 121 and the treatment solution nozzle 122 substantially coincide with the position on the substrate G to which the developing solution is supplied from the developing solution nozzle 120. To the rinse solution nozzle 121 and the treatment solution nozzle 122, a solution supply pipe 142 supplying the rinse solution and the treatment solution to the rinse solution nozzle 121 and the treatment solution nozzle 122 is connected. The solution supply pipe 142 has a double pipe structure having two inner pipes 143, 144 therein. Through the first inner pipe 143, the rinse solution temperature-regulated at, for example, 3° C. flows. The first inner pipe 143 is connected to the rinse solution nozzle 121. Through the second inner pipe 144, the treatment solution temperature-regulated at, for example, 3° C. flows. The second inner pipe 144 is connected to the treatment solution nozzle 122. Further, between the inner pipes 143, 144 and an outer pipe 145, a purge gas, for example, air or nitrogen gas, at room temperature containing no moisture flows. This purge gas prevents dew condensation on the solution supply pipe 142.

The upper end portion of the developing solution nozzle 120 is supported by a support member 150. Further, the rinse solution nozzle 121 and the treatment solution nozzle 122 are arranged penetrating through the support member 150. A joint 151 for providing a temperature sensor (not shown) measuring the temperature of the developing solution is connected to one side surface of the support member 150. Further, the other side surface of the support member 150 is supported by the arm 111.

On the upper surface of the support member 150, a ventilation member 152 is provided. The ventilation member 152 is formed having a hollow inside for allowing the purge gas in the developing solution supply pipe 131 and the purge gas in the solution supply pipe 142 to circulate therein.

Figure 13:
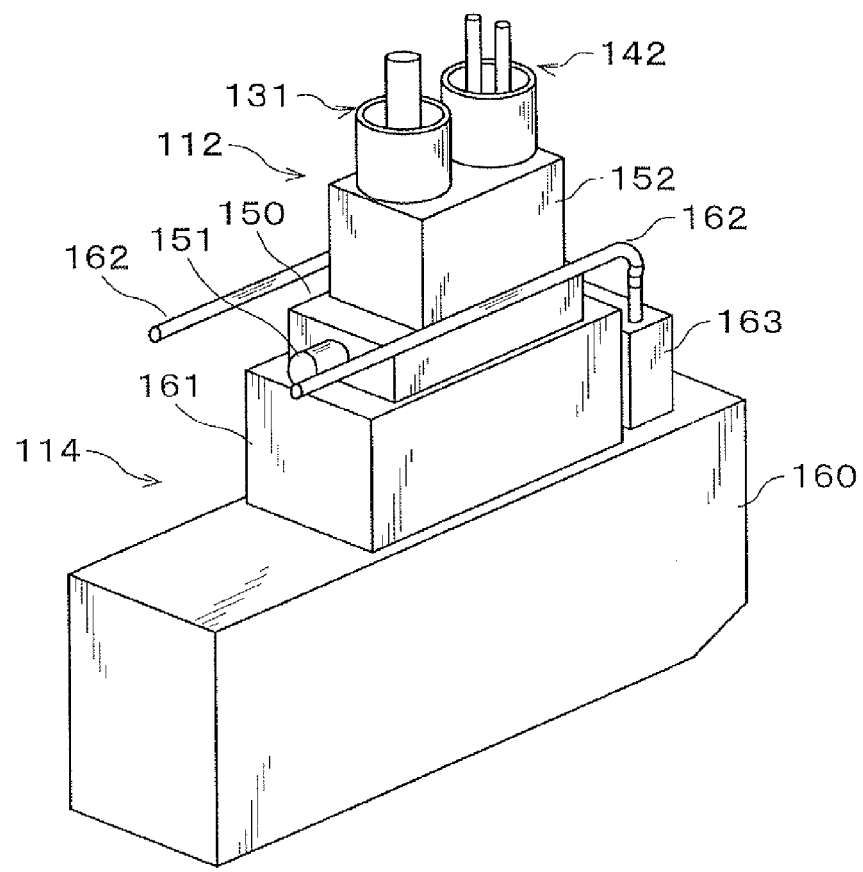
FIG. 13 is a perspective view of the complex nozzle body and a nozzle bath.

The composite nozzle body 112 when not performing treatment on the substrate G waits in the nozzle bath 114 as shown in FIG. 13. The tip portion of the composite nozzle body 112 is housed in the nozzle bath 114. The support member 150, the joint 151 and the ventilation member 152 of the composite nozzle body 112 protrude from the nozzle bath 114 and are thus exposed to the atmosphere in the treatment container 80.

The nozzle bath 114 has a bath body 160. On the upper surface of the bath body 160, a housing part 161 housing the tip portion of the composite nozzle body 112 is provided as described above.

The nozzle bath 114 has a pair of purge gas nozzles 162, 162. The pair of purge gas nozzles 162, 162 are connected to a purge gas supply source 163 provided on the upper surface of the bath body 160. The pair of purge gas nozzles 162, 162 are provided across the composite nozzle body 112 waiting in the nozzle bath 114. Each purge gas nozzle 162 extends in the horizontal direction in a manner to be close to the support member 150, the joint 151 and the ventilation member 152 which protrude from the nozzle bath 114 as described above. From a plurality of supply ports (not shown) formed in the longitudinal direction of each purge gas nozzle 162, a purge gas, for example, air or nitrogen gas, at room temperature containing no moisture is supplied to the support member 150, the joint 151 and the ventilation member 152. This purge gas prevents dew condensation on the support member 150, the joint 151 and the ventilation member 152. Note that the purge gas at room temperature containing no moisture is supplied also into the nozzle bath 114 to prevent dew condensation on the tip end portion of the waiting composite nozzle body 112.

Figure 14:
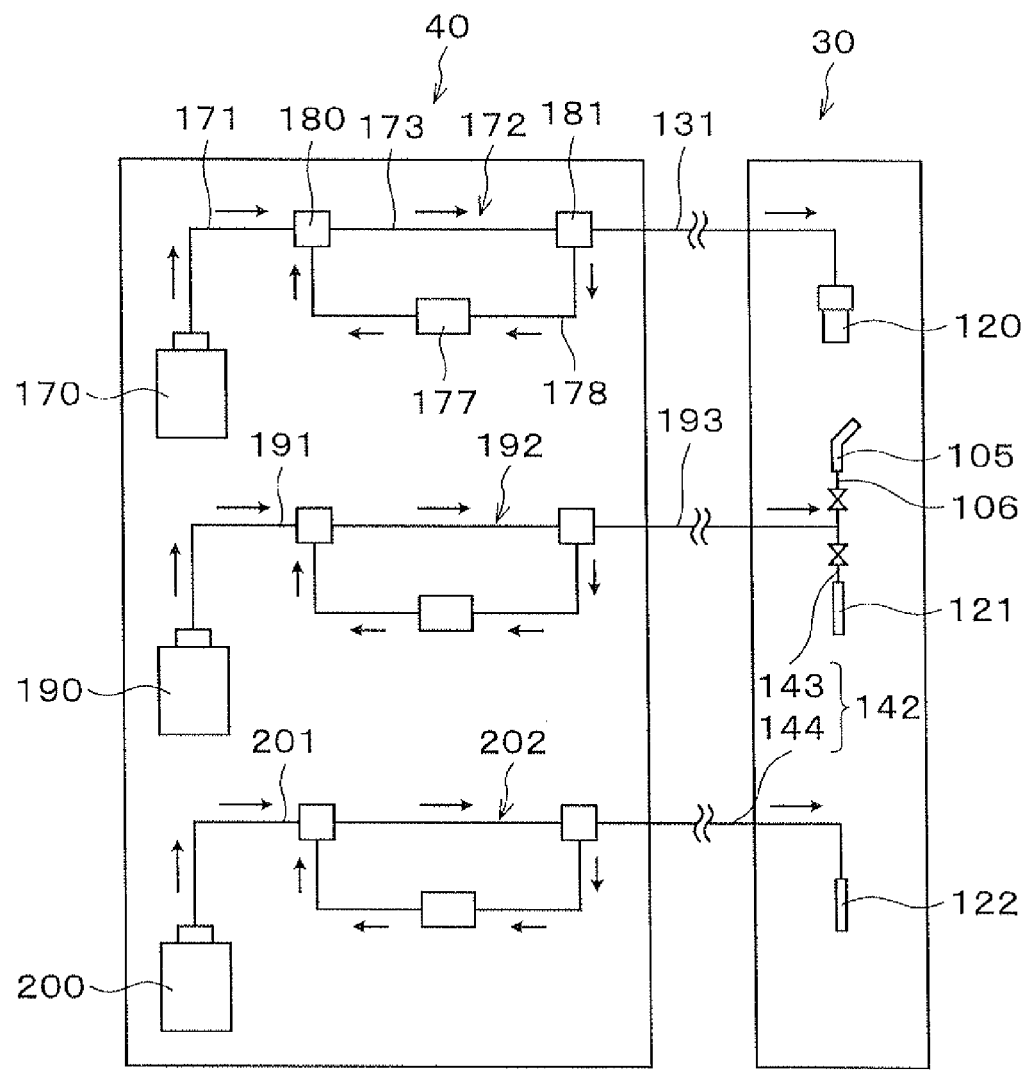
FIG. 14 is an explanatory diagram showing the outline of a configuration of a solution supply apparatus.

Next, the configuration of the above-described solution supply apparatus 40 will be described. The solution supply apparatus 40 has a developing solution supply source 170 storing a developing solution before temperature regulation as shown in FIG. 14. Note that an organic developing solution is used for the developing solution in this embodiment.

Figure 15:
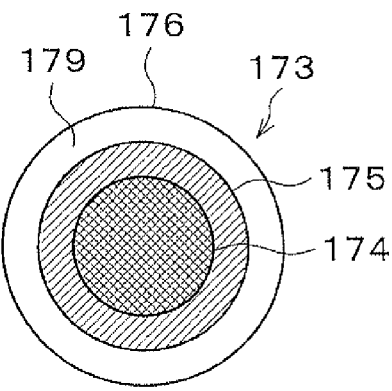
FIG. 15 is a longitudinal sectional view showing the outline of a configuration of a temperature regulating pipe.

On the downstream side of the developing solution supply source 170, a temperature regulating part 172 is provided which temperature-regulates the developing solution is provided via a supply pipe 171. The temperature regulating part 172 has a temperature regulating pipe 173 regulating the temperature of the developing solution. The temperature regulating pipe 173 has a triple pipe structure including a first pipe 174, a second pipe 175 surrounding the first pipe 174, and a third pipe 176 surrounding the second pipe 175 as shown in FIG. 15. Through the first pipe 174, the developing solution flows. Between the first pipe 174 and the second pipe 175, a temperature regulating water temperature-regulating the developing solution to a predetermined temperature, for example, 3° C. flows. The temperature regulating water is temperature-regulated by a chiller 177 to, for example, 3° C., and circulates in the temperature regulating pipe 173 and a pipe 178 as shown in FIG. 14. As shown in FIG. 15, between the second pipe 175 and the third pipe 176, an air layer 179 is formed. In the air layer 179, for example, a purge gas, for example, air or nitrogen gas, at room temperature containing no moisture flows. The air layer 179 prevents dew condensation on the temperature regulating pipe 173. Note that ethylene glycol is used for the temperature regulating water. For the material of the first pipe 174, for example, fluorine based resin (for example, a product "Teflon" manufactured by DuPont) is used, and for the material of the second pipe 175 and the third pipe 176, for example, silicon is used.

At the end portion on the upstream side of the temperature regulating pipe 173, a connecting part 180 connecting the supply pipe 171 and the temperature regulating pipe 173 is provided as shown in FIG. 14. The connecting part 180 can regulate the flow rate and the like of the developing solution to be supplied from the developing solution supply source 170 to the temperature regulating pipe 173.

At the end portion on the downstream side of the temperature regulating pipe 173, a connecting part 181 connecting the temperature regulating pipe 173 and the developing solution supply pipe 131 is provided. The connecting part 181 can regulate the flow rate and the like of the developing solution to be supplied from the developing solution supply pipe 131 to the developing solution nozzle 120 of the developing apparatus 30.

The solution supply apparatus 40 has a rinse solution supply source 190 storing a rinse solution before temperature regulation. For the rinse solution, an organic rinse solution is used in this embodiment. On the downstream side of the rinse solution supply source 190, a temperature regulating part 192 is provided which temperature-regulates the rinse solution to, for example, 3° C. via a supply pipe 191. The configuration of the temperature regulating part 192 is the same as the configuration of the above-described temperature regulating part 172 and therefore the description thereof will be omitted. To the downstream side of the temperature regulating part 192, a supply pipe 193 is connected. The supply pipe 193 branches out, on its downstream side, into the supply pipe 106 and the first inner pipe 143 of the solution supply pipe 142. In other words, the rinse solution temperature-regulated to, for example, 3° C. is supplied to the back rinse nozzles 105 and the rinse solution nozzle 121 of the developing apparatus 30.

Further, the solution supply apparatus 40 has a treatment solution supply source 200 storing a treatment solution before temperature regulation. For the treatment solution, isopropyl alcohol is used in this embodiment. On the downstream side of the treatment solution supply source 200, a temperature regulating part 202 is provided which temperature-regulates the treatment solution to, for example, 3° C. via a supply pipe 201. The configuration of the temperature regulating part 202 is the same as the configuration of the above-described temperature regulating part 172 and therefore the description thereof will be omitted. To the downstream side of the temperature regulating part 202, the inner pipe 144 of the solution supply pipe 142 is connected. In other words, the treatment solution temperature-regulated to, for example, 3° C. is supplied to the treatment solution nozzle 122 of the developing apparatus 30.

Next, the above-described control unit 41 will be described. The control unit 41 is, for example, a computer and has a program storage part (not shown). In the program storage part, a program executing the developing treatment of the substrate G in the developing treatment system 1 is stored. Note that the program may be the one that is stored, for example, in a computer-readable storage medium such as a computer-readable hard disk (HD), flexible disk (FD), compact disk (CD), magneto-optical disk (MO), or memory card, and installed from the storage medium into the control unit 41.

Figure 16:
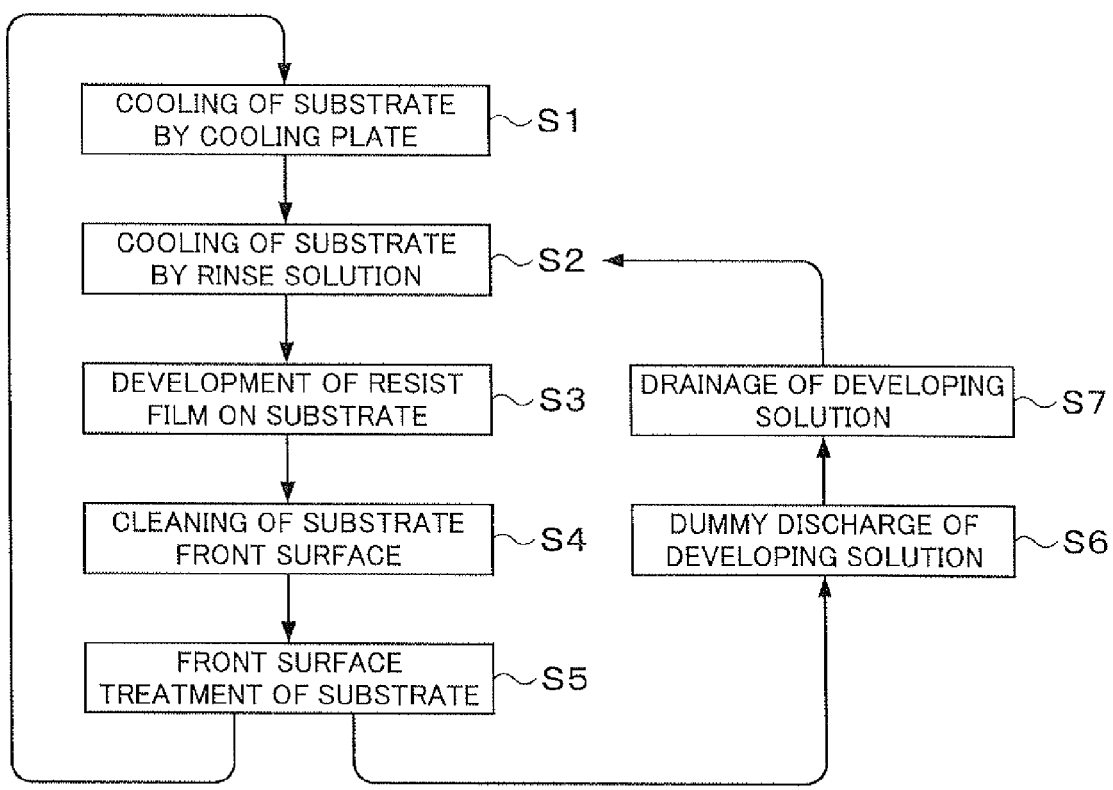
FIG. 16 is a flowchart showing steps of the developing treatment.

The developing treatment system 1 according to this embodiment is configured as described above. Next, the developing treatment performed in the developing treatment system 1 will be described. FIG. 16 is a main treatment flow of the developing treatment.

First, one substrate G is taken out of the cassette C on the cassette mounting table 10 by the carrier apparatus 11 and carried to the transition apparatus 22 in the treatment station 3. In this event, the substrate G is carried by the first carrier arm 50 of the carrier apparatus 11. The temperature of the substrate G at this stage is room temperature.

The substrate G is then held by the second carrier arm 51 of the carrier apparatus 11 and carried to the cooling apparatus 20. The substrate G carried into the cooling apparatus 20 is passed to the raising and lowering pins 72 and mounted on the cooling plate 76. In this event, the temperature of the atmosphere in the cooling apparatus 20 has been regulated to, for example, 15° C., and the cooling plate 76 has also been temperature-regulated to, for example, 15° C. Thus, the substrate G on the cooling plate 76 is cooled to, for example, 15° C. (Step S1 in FIG. 16).

The substrate G is then held by the second carrier arm 51 of the carrier apparatus 11 and carried to the developing apparatus 30. The substrate G carried into the developing apparatus 30 is held on the holding member 90. In this event, the temperature of the atmosphere in the developing apparatus 30 has been regulated to, for example, 15° C. Subsequently, the composite nozzle body 112 is moved to a position above the center portion of the substrate G and the substrate G is rotated. Then, the rinse solution at, for example, 3° C. is supplied from the rinse solution nozzle 121 to the front surface of the rotated substrate G, and the rinse solution at, for example, 3° C. is jetted from the back rinse nozzles 105 to the rear surface of the substrate G. Thus, the substrate G is cooled to about 3° C. (Step S2 in FIG. 16).

Thereafter, the supply of the rinse solution from the rinse solution nozzle 121 and the back rinse nozzles 105 is stopped, and the developing solution at, for example, 3° C. is subsequently supplied from the developing solution nozzle 120 onto the rotated substrate G. The supplied developing solution is diffused over the substrate G by the centrifugal force, whereby the resist film on the substrate G is developed (Step S3 in FIG. 16). Since the substrate G has been previously cooled to about 3° C. in this event, the developing speed can be sufficiently decreased. Accordingly, the developing treatment can be uniformly performed within the substrate, so that a predetermined resist pattern can be formed on the substrate G.

Thereafter, the supply of the developing solution from the developing solution nozzle 120 is stopped, and the rinse solution at, for example, 3° C. is subsequently supplied from the rinse solution nozzle 121 onto the rotated substrate G. This rinse solution cleans the front surface of the substrate G (Step S4 in FIG. 16).

Thereafter, the supply of the rinse solution from the rinse solution nozzle 121 is stopped, and the treatment solution at, for example, 3° C. is subsequently supplied from the treatment solution nozzle 122 onto the rotated substrate G. If the rinse solution is supplied onto the substrate G here in Step S4, so-called pattern collapse is likely to occur. The pattern collapse is a phenomenon that the resist pattern is drawn by the surface tension of the rinse solution to collapse, and prominently occurs especially when a fine resist pattern is formed. In this embodiment, isopropyl alcohol that is the treatment solution is supplied onto the substrate G to decrease the surface tension of the rinse solution remaining on the resist pattern, whereby the pattern collapse can be prevented. Thus, the front surface treatment of the substrate G is performed by the treatment solution (Step S5 in FIG. 16).

Thereafter, the supply of the treatment solution from the treatment solution nozzle 122 is stopped, and the substrate G is continuously rotated to spin off the treatment solution for dry. Thereafter, the rotation of the substrate G is stopped, and the complex nozzle body 112 is moved from the position above the center portion of the substrate G to the nozzle bath 114.

After the treatment in the developing apparatus 30 is finished as described above, the substrate G is passed from the holding member 90 to the second carrier arm 51 of the carrier apparatus 11 and carried out of the developing apparatus 30. The substrate G is then carried by the carrier apparatus 11 to the transition apparatus 21, and then held by the first carrier arm 50 of the carrier apparatus 11 and returned to the cassette C on the cassette mounting table 10. Thus, a series of developing treatment in the developing treatment system 1 ends.

A next substrate $G_N$, after taken out of the cassette C on the cassette mounting table 10, is carried to the cooling apparatus 20 and cooled (Step S1 in FIG. 16). Then, the substrate $G_N$ is carried to the developing apparatus 30. In this event, the purge gas is supplied from the pair of purge gas nozzles 162, 162 to the complex nozzle body 112 waiting in the nozzle bath 114 in the developing apparatus 30, whereby dew condensation on the complex nozzle body 112 is prevented.

Before the substrate $G_N$ is carried to the developing apparatus 30 and subjected to the predetermined treatment, the developing solution remaining in the developing solution supply pipe 131 is drained from the developing solution nozzle 120 of the waiting complex nozzle body 112 into the nozzle bath 114 and discarded (Step S6 in FIG. 16). The drainage of the developing solution is performed because the temperature of the developing solution in the developing solution supply pipe 131 increases to be 3° C. or higher during waiting of the complex nozzle body 112. Thereafter, the developing solution temperature-regulated at 3° C. is supplied from the solution supply apparatus 40 to the developing solution nozzle 120, and dummy discharge of the developing solution is performed in the developing solution nozzle 120 (Step S7 in FIG. 16). The dummy discharge is performed for stabilizing the temperature of the developing solution supplied from the developing solution nozzle 120 to 3° C. Note that the drainage of the rinse solution and the treatment solution in the solution supply pipe 142 in Step S6 and the dummy discharge in Step S7 are similarly performed also in each of the rinse solution nozzle 121 and the treatment solution nozzle 122.

Thereafter, when the substrate $G_N$ is carried into the developing apparatus 30, the complex nozzle body 112 is moved to a position above the center portion of the substrate $G_N$. Subsequently, cooling of the substrate $G_N$ by the rinse solution (Step S2 in FIG. 16), development of the resist film on the substrate $G_N$ by the developing solution (Step S3 in FIG. 16), cleaning of the front surface of the substrate $G_N$ by the rinse solution (Step S4 in FIG. 16), front surface treatment of the substrate $G_N$ by the treatment solution (Step S5 in FIG. 16) are sequentially performed. Thereafter, the substrate $G_N$ is returned to the cassette C on the cassette mounting table 10.

According to the above embodiment, the substrate G is cooled to about 15° C. by the cooling plate 76 in Step S1, and the substrate G is cooled to about 3° C. by the rinse solution in Step S2. Since the substrate G is cooled at two stages in Step S1 and Step S2, the substrate G can be surely cooled to about 3° C. Therefore, even when the developing solution at 3° C. is supplied from the developing solution nozzle 120 onto the substrate G in the subsequent Step S3, the developing speed can be sufficiently decreased. In addition, since the temperatures of the rinse solution and the treatment solution supplied onto the substrate G in Step S4 and Step S5 are 3° C. that is the same as the temperature of the developing solution, there is no adverse effect on the resist pattern formed on the substrate G. Accordingly, the developing treatment can be performed uniformly within the substrate, so that a fine pattern can be appropriately formed on the substrate G.

Since the temperature of each of the atmosphere in the cooling apparatus 20 and the atmosphere in the developing apparatus 30 is kept at 15° C. lower than room temperature, the substrate G can be more surely cooled down to about 3° C.

In Step S2, the rinse solution is supplied from the rinse solution nozzle 121 and the back rinse nozzles 105 to the substrate G to cool the substrate G from both the front surface and the rear surface. Accordingly, it is possible to quickly cool the substrate G and improve the throughput of the developing treatment of the substrate G.

In Step S5, since the treatment solution is supplied onto the substrate G, the surface tension of the rinse solution remaining on the resist pattern on the substrate G can be decreased. Accordingly, so-called pattern collapse can be prevented.

In Step S6, after completion of the treatment of one substrate G in the developing apparatus 30 and before a next substrate $G_N$ is treated, the developing solution remaining in the developing solution supply pipe 131 is drained from the developing solution nozzle 120 into the nozzle bath 114. The rinse solution and the treatment solution remaining in the solution supply pipe 142 are similarly drained from the rinse solution nozzle 121 and the treatment solution nozzle 122 into the nozzle bath 114 respectively. This makes it possible to treat the substrate $G_N$ using the developing solution, the rinse solution and the treatment solution at appropriate temperatures.

On the side surfaces 80a of the treatment container 80 of the developing apparatus 30, the air layers 82 are formed between the side surfaces 80a and the panels 81, so that the dew condensation on the panels 81 can be prevented. Further, since the air layer 179 is formed between the outermost third pipe 176 and the second pipe 175 of the temperature regulating pipe 173 in the solution supply apparatus 40, dew condensation on the temperature regulating pipe 173 can be prevented. Accordingly, electronic control components and the like (not shown) in the control unit 41 are not adversely affected by water drops by dew condensation.

Figure 17:
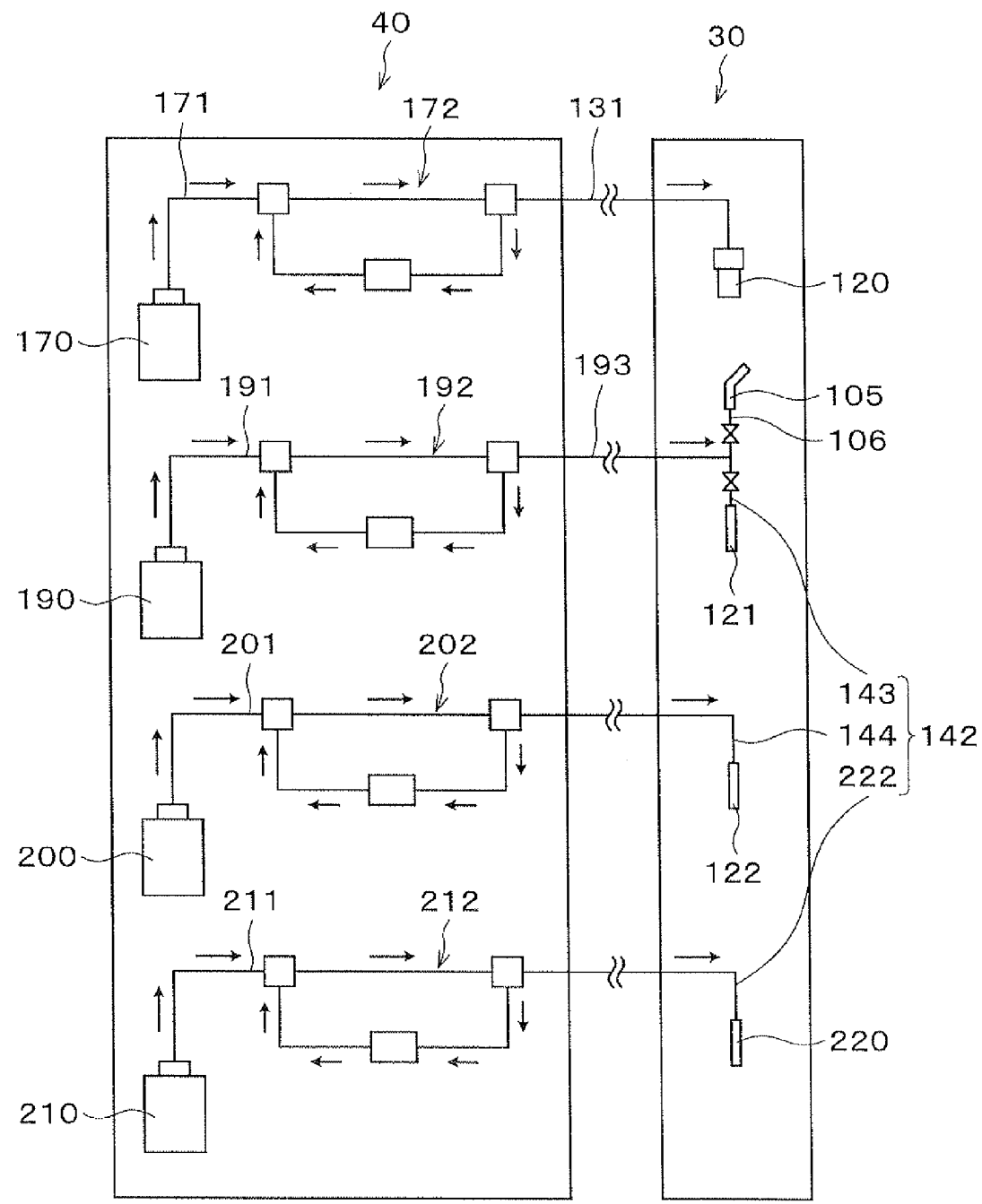
FIG. 17 is an explanatory diagram showing the outline of a solution supply apparatus according to another embodiment.

Though the temperature of the rinse solution used for cooling the substrate G in Step S2 is the predetermined temperature, for example, 3° C. in the above embodiment, the temperature of the rinse solution may be lower than 3° C. More specifically, the temperature of the rinse solution supplied from the rinse solution nozzle 121 and the back rinse nozzles 105 to the substrate G may be lower than 3° C. In this case, the temperature of the rinse solution is temperature-regulated to a temperature lower than 3° C. in the temperature regulating part 192 provided downstream of the rinse solution supply source 190 of the solution supply apparatus 40 as shown in FIG. 17.

Further, since the temperature of the rinse solution used for cleaning the substrate G in Step S4 is 3° C., a mechanism temperature-regulating the rinse solution to 3° C. and supplying the rinse solution is separately provided in the solution supply apparatus 40. More specifically, a rinse solution supply source 210 storing a rinse solution before temperature regulation and a temperature regulating part 212 temperature-regulating the rinse solution to 3° C. downstream of the rinse solution supply source 210 via a supply pipe 211 are separately provided in the solution apparatus 40. Then, the rinse solution temperature-regulated to 3° C. in the temperature regulating part 212 is supplied to another rinse solution nozzle 220 that will be described later. Note that the configuration of the temperature regulating part 212 is the same as the configuration of the above-described temperature regulating part 172, and therefore the description thereof will be omitted.

Figure 18:
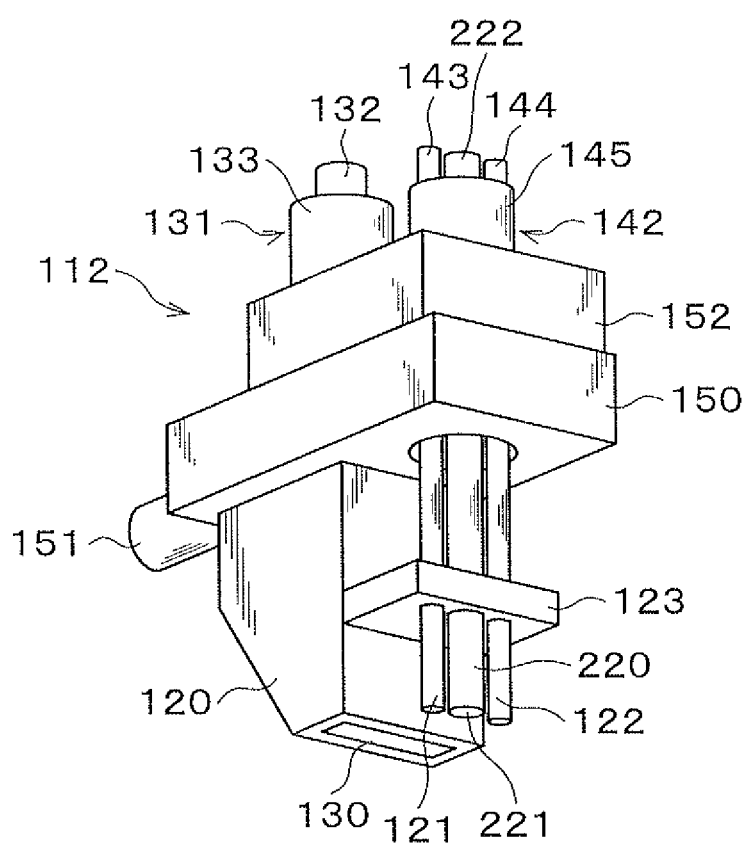
FIG. 18 is a perspective view of a complex nozzle body according to another embodiment.

As shown in FIG. 18, a complex nozzle body 112 has the another rinse solution nozzle 220 supplying the rinse solution temperature-regulated to 3° C. in the temperature regulating part 212 onto the substrate G. The another rinse solution nozzle 220 is fixed to the developing solution nozzle 120 via the fixing member 123 together with the rinse solution nozzle 121 and the treatment solution nozzle 122. At the lower end surface of the another rinse solution nozzle 220, a supply port 221 in an almost circular shape is formed. To the another rinse solution nozzle 220, the above-described solution supply pipe 142 is connected. In the solution supply pipe 142, an inner pipe 222 through which the rinse solution at 3° C. flows is provided in addition to the two inner pipes 143, 144. The inner pipe 222 is connected to the another rinse solution nozzle 220. Note that the remaining configuration of the complex nozzle body 112 is the same as the configuration of the above-described complex nozzle body 112 shown in FIG. 12, and therefore the description thereof will be omitted.

In this case, the rinse solution at a temperature lower than 3° C. is supplied from the rinse solution nozzle 121 and the back rinse nozzles 105 to the substrate G in Step S2 in FIG. 16, whereby the substrate G is cooled. Then, in Step S4, the rinse solution at 3° C. is supplied from the another rinse solution nozzle 220 onto the substrate G, whereby the front surface of the substrate G is cleaned. Note that the other treatment steps are the same as those shown in FIG. 16 and the description thereof will be omitted.

According to this embodiment, since the rinse solution at a temperature lower than 3° C. is supplied in Step S2, the substrate G can be more quickly cooled down to about 3° C. Accordingly, the throughput of the developing treatment of the substrate G can be improved.

The rinse solution nozzle 121, the treatment solution nozzle 122, and the another rinse solution nozzle 220 are connected to one solution supply pipe 142 in the above embodiment, but may be connected to individual solution supply pipes respectively. In this case, each of the solution supply pipes has a double pipe structure and has the same configuration as that of the above-described developing solution supply pipe 131. More specifically, the rinse solution or the treatment solution flows through the inner pipe of the solution supply pipe, and the purge gas at room temperature containing no moisture flows between the inner pipe and the outer pipe. The purge gas can prevent dew condensation on each solution supply pipe.

The developing treatment of the substrate G for mask has been described in the above embodiments, but the present invention is also applicable to the case where the substrate is, for example, a semiconductor wafer or a FPD (Flat Panel Display). In recent years, using a method, so-called imprint, instead of performing the photolithography on the substrate has been proposed in order to form a finer pattern on the substrate. This imprint method is to press-contact a template having a fine pattern on its surface onto a resist surface formed on the substrate and then peel it off to thereby directly transfer the pattern to the resist surface. The present invention is also applicable to the developing treatment performed on such template. Further, the template may be subjected to the developing treatment of the present invention while being held, for example, on a holder.

Though the case where the developing treatment is performed on the substrate G using the organic developing solution and the organic rinse solution has been described in the above embodiments, the present invention is also applicable to the case where the developing treatment is performed on the substrate using an alkaline developing solution and the rinse solution that is pure water.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention.

The present invention is useful in developing a resist film on a substrate using a developing solution at a temperature lower than room temperature.

What is claimed is:

1. A method of developing a resist film on a substrate using a developing solution at a predetermined temperature lower than room temperature using a developing treatment system, comprising:
    a cooling apparatus including a cooling plate mounting and cooling the substrate thereon;
    a developing apparatus including a developing solution nozzle supplying the developing solution onto the substrate, and a rinse solution nozzle supplying a rinse solution at the predetermined temperature or lower onto the substrate;
    a solution supply apparatus including a temperature regulating pipe for regulating the developing solution to the predetermined temperature, and the temperature regulating pipe having a triple pipe structure including a first pipe, a second pipe surrounding the first pipe, and a third pipe surrounding the second pipe; and
    a control unit controlling said developing treatment system and performing method steps as follows:
        a first cooling step of mounting and cooling the substrate on the cooling plate at a temperature lower than room temperature and higher than the predetermined temperature in a cooling apparatus;
        a second cooling step of supplying a rinse solution at the predetermined temperature or lower onto the substrate to cool the substrate in the developing apparatus;
        a developing step of then supplying the developing solution from the developing solution nozzle onto the substrate and developing the resist film on the substrate to form a resist pattern in the resist film, the developing step including flowing the developing solution through the first pipe, flowing a temperature regulating water flowing between the first pipe and the second pipe that regulates the developing solution to the predetermined temperature, and forming an air layer between the second pipe and the third pipe; and
        a cleaning step of then supplying a rinse solution at the predetermined temperature from the rinse nozzle onto the substrate to clean a front surface of the substrate.

2. The developing treatment method as set forth in claim 1, wherein in said developing step, the developing solution regulated to the predetermined temperature is supplied from a solution supply apparatus via a supply pipe to a developing solution nozzle in the developing apparatus, and the developing solution is supplied from the developing solution nozzle onto the substrate,
    wherein after said developing step is performed on one substrate, the supply of the developing solution to the developing solution nozzle is stopped, and
    wherein thereafter, before said developing step is performed on a next substrate, the developing solution remaining in the supply pipe is drained from the developing solution nozzle.

3. The developing treatment method as set forth in claim 1, wherein temperatures of atmospheres in the cooling apparatus and the developing apparatus are temperatures lower than room temperature and higher than the predetermined temperature.

4. The developing treatment method as set forth in claim 1, wherein after said cleaning step, a treatment solution at the predetermined temperature is supplied onto the substrate to decrease a surface tension of the rinse solution on the resist pattern.

5. The developing treatment method as set forth in claim 1, wherein in said second cooling step, the rinse solution at the predetermined temperature or lower is supplied to the front surface and a rear surface of the substrate.

6. The developing treatment method as set forth in claim 1, wherein the predetermined temperature is 1° C. to 10° C., and the temperature of the cooling plate is 15° C., and the temperatures of the atmospheres in the cooling apparatus and the developing apparatus are 15° C.

7. A developing treatment system developing a resist film on a substrate using a developing solution at a predetermined temperature lower than room temperature, comprising:
a cooling apparatus including a cooling plate mounting and cooling the substrate thereon;
a developing apparatus including a developing solution nozzle supplying the developing solution onto the substrate, and a rinse solution nozzle supplying a rinse solution at the predetermined temperature or lower onto the substrate;
a solution supply apparatus regulating the developing solution to the predetermined temperature and supplying the developing solution to the developing solution nozzle, said solution supply apparatus including a temperature regulating pipe for regulating the developing solution to the predetermined temperature, and the temperature regulating pipe having a triple pipe structure including a first pipe, a second pipe surrounding the first pipe, and a third pipe surrounding the second pipe;
a supply pipe connecting said solution supply apparatus and the developing solution nozzle; and
a control unit controlling said cooling apparatus and said developing apparatus to execute:
a first cooling step of mounting and cooling the substrate on the cooling plate at a temperature lower than room temperature and higher than the predetermined temperature in said cooling apparatus;
a second cooling step of supplying the rinse solution at the predetermined temperature or lower from the rinse solution nozzle onto the substrate to cool the substrate in said developing apparatus;
a developing step of then supplying the developing solution from the developing solution nozzle onto the substrate and developing the resist film on the substrate to form a resist pattern in the resist film, the developing solution flowing through the first pipe, a temperature regulating water flowing between the first pipe and the second pipe that regulates the developing solution to the predetermined temperature, and an air layer being formed between the second pipe and the third pipe; and
a cleaning step of then supplying a rinse solution at the predetermined temperature from the rinse solution nozzle onto the substrate to clean a front surface of the substrate,
wherein said control unit controls said developing apparatus to perform the developing step on one substrate, then stops the supply of the developing solution to the developing solution nozzle, and thereafter drains the developing solution remaining in the supply pipe from the developing solution nozzle before performing the developing step on a next substrate.

8. The developing treatment system as set forth in claim 7, wherein a purge gas containing no moisture flows through the air layer.

9. The developing treatment system as set forth in claim 7, wherein said developing apparatus has a treatment container capable of hermetically closing an inside thereof, and
wherein a panel is provided at a side surface of the treatment container to form an air layer between the panel and the side surface.

10. The developing treatment system as set forth in claim 7, wherein said control unit controls temperatures of atmospheres in said cooling apparatus and said developing apparatus to temperatures lower than room temperature and higher than the predetermined temperature.

11. The developing treatment system as set forth in claim 7, wherein said developing apparatus further has a treatment solution nozzle supplying a treatment solution at the predetermined temperature onto the substrate, and
wherein said control unit controls said developing apparatus to supply, after the cleaning step, the treatment solution from the treatment solution nozzle onto the substrate to decrease a surface tension of the rinse solution on the resist pattern.

12. The developing treatment system as set forth in claim 7, wherein the rinse solution in the second cooling step and the rinse solution in the cleaning step are supplied from different rinse solution nozzles respectively.

13. The developing treatment system as set forth in claim 7, wherein said developing apparatus has a back rinse nozzle supplying the rinse solution at the predetermined temperature or lower to a rear surface of the substrate.

14. The developing treatment system as set forth in claim 7, wherein the predetermined temperature is 1° C. to 10° C., and said control unit controls the temperature of the cooling plate to 15° C. and controls temperatures of atmospheres in said cooling apparatus and said developing apparatus to 15° C.

15. A developing treatment system developing a resist film on a substrate using a developing solution at a predetermined temperature lower than room temperature, comprising:
a cooling apparatus including a cooling plate mounting and cooling the substrate thereon;
a developing apparatus including a developing solution nozzle supplying the developing solution onto the substrate, and a rinse solution nozzle supplying a rinse solution at the predetermined temperature or lower onto the substrate;
a solution supply apparatus including a temperature regulating pipe for regulating the developing solution to the predetermined temperature, and the temperature regulating pipe having a triple pipe structure including a first pipe, a second pipe surrounding the first pipe, and a third pipe surrounding the second pipe; and
a control unit controlling said cooling apparatus and said developing apparatus to execute:
a first cooling step of mounting and cooling the substrate on the cooling plate at a temperature lower than room temperature and higher than the predetermined temperature in said cooling apparatus;
a second cooling step of supplying the rinse solution at the predetermined temperature or lower from the rinse solution nozzle onto the substrate to cool the substrate in said developing apparatus;
a developing step of then supplying the developing solution from the developing solution nozzle onto the substrate and developing the resist film on the substrate to form a resist pattern in the resist film, the developing solution flowing through the first pipe, a temperature regulating water flowing between the first pipe and the second pipe that regulates the developing solution to the predetermined temperature, and an air layer being formed between the second pipe and the third pipe; and a cleaning step of then supplying a rinse solution at the predetermined temperature from the rinse solution nozzle onto the substrate to clean a front surface of the substrate.

16. The developing treatment system as set forth in claim 15, further comprising:

a supply pipe connecting said solution supply apparatus and the developing solution nozzle, wherein the solution supply apparatus regulates the developing solution to the predetermined temperature and supplying the developing solution to the developing solution nozzle, and wherein said control unit controls said developing apparatus to perform the developing step on one substrate, then stop the supply of the developing solution to the developing solution nozzle, and thereafter drain the developing solution remaining in the supply pipe from the developing solution nozzle before performing the developing step on a next substrate.

17. The developing treatment system as set forth in claim 15, wherein a purge gas containing no moisture flows through the air layer.

18. The developing treatment system as set forth in claim 15, wherein said developing apparatus has a treatment container capable of hermetically closing an inside thereof, and wherein a panel is provided at a side surface of the treatment container to form an air layer between the panel and the side surface.

19. The developing treatment system as set forth in claim 15, wherein said control unit controls temperatures of atmospheres in said cooling apparatus and said developing apparatus to temperatures lower than room temperature and higher than the predetermined temperature.

20. The developing treatment system as set forth in claim 15, wherein said developing apparatus further has a treatment solution nozzle supplying a treatment solution at the predetermined temperature onto the substrate, and wherein said control unit controls said developing apparatus to supply, after the cleaning step, the treatment solution from the treatment solution nozzle onto the substrate to decrease a surface tension of the rinse solution on the resist pattern.

21. The developing treatment system as set forth in claim 15, wherein the rinse solution in the second cooling step and the rinse solution in the cleaning step are supplied from different rinse solution nozzles respectively.

22. The developing treatment system as set forth in claim 15, wherein said developing apparatus has a back rinse nozzle supplying the rinse solution at the predetermined temperature or lower to a rear surface of the substrate.

23. The developing treatment system as set forth in claim 15, wherein the predetermined temperature is 1° C. to 10° C., and said control unit controls the temperature of the cooling plate to 15° C. and controls temperatures of atmospheres in said cooling apparatus and said developing apparatus to 15° C.

* * * * *